United States Patent
Hsu

(10) Patent No.: US 9,590,020 B2
(45) Date of Patent: Mar. 7, 2017

(54) MANUFACTURE METHOD OF AMOLED BACK PLATE AND STRUCTURE THEREOF

(71) Applicant: Shenzhen China Star Optoelectronics Technology Co., Ltd., Shenzhen, Guangdong (CN)

(72) Inventor: Yuanjun Hsu, Guangdong (CN)

(73) Assignee: Shenzhen China Star Optoelectronics Technology Co., Ltd, Shenzhen, Guangdong (CN)

(*) Notice: Subject to any disclaimer, the term of this patent is extended or adjusted under 35 U.S.C. 154(b) by 111 days.

(21) Appl. No.: 14/429,082

(22) PCT Filed: Feb. 9, 2015

(86) PCT No.: PCT/CN2015/072505
§ 371 (c)(1),
(2) Date: Mar. 18, 2015

(87) PCT Pub. No.: WO2016/101392
PCT Pub. Date: Jun. 30, 2016

(65) Prior Publication Data
US 2016/0190220 A1    Jun. 30, 2016

(30) Foreign Application Priority Data
Dec. 26, 2014    (CN) .......................... 2014 1 0837308

(51) Int. Cl.
*H01L 27/14*    (2006.01)
*H01L 21/00*    (2006.01)
(Continued)

(52) U.S. Cl.
CPC ...... *H01L 27/3262* (2013.01); *H01L 21/0262* (2013.01); *H01L 21/02532* (2013.01);
(Continued)

(58) Field of Classification Search
CPC ............. H01L 27/3262; H01L 27/3246; H01L 27/3248; H01L 27/3265; H01L 21/02532;
(Continued)

(56) References Cited

U.S. PATENT DOCUMENTS 8,299,471 B2 * 10/2012 Liu ...................... H01L 27/1214
257/72
8,716,040 B2 * 5/2014 Shin .................... H01L 27/1288
438/22

(Continued)

*Primary Examiner* — Cheung Lee
*Assistant Examiner* — Stephen C Smith
(74) *Attorney, Agent, or Firm* — Andrew C. Cheng

(57) ABSTRACT

The present invention provides a manufacture method of an AMOLED back plate and a structure thereof. The manufacture method of the AMOLED back plate is: sequentially deposing a buffer layer (2), an amorphous silicon layer (2) on a substrate (1), and crystallizing and converting the amorphous silicon layer to be a polysilicon layer, and patterning the polysilicon layer, and then deposing a P type heavy doped micro silicon layer (P+uc-Si), and implementing a photo process to define a position of a channel (40), and etching the P type heavy doped micro silicon layer (P+uc-Si) to form a source/a drain (41), and thereafter, sequentially forming a gate isolation layer (5), a gate (61), an interlayer insulation layer (7), a metal source/a metal drain (81), a flat layer (9), an anode (10), a pixel definition layer (11) and a photo spacer (12); the source/the drain (41) and the gate (61) do not overlap in the horizontal direction and are mutually spaced. The method can improve the electrical property of the drive TFT to make the conductive current higher, and the leakage current lower, and diminish the image sticking for raising the display quality of the AMOLED.

6 Claims, 5 Drawing Sheets

(51) Int. Cl.
| | |
|---|---|
| H01L 21/84 | (2006.01) |
| H01L 27/32 | (2006.01) |
| H01L 21/02 | (2006.01) |
| H01L 21/306 | (2006.01) |
| H01L 29/417 | (2006.01) |
| H01L 29/49 | (2006.01) |
| H01L 29/66 | (2006.01) |
| H01L 29/786 | (2006.01) |
| H01L 51/52 | (2006.01) |
| H01L 51/56 | (2006.01) |
| H01L 29/45 | (2006.01) |
| H01L 27/12 | (2006.01) |

(52) U.S. Cl.
CPC .. *H01L 21/02592* (2013.01); *H01L 21/02675* (2013.01); *H01L 21/30604* (2013.01); *H01L 27/1255* (2013.01); *H01L 27/3246* (2013.01); *H01L 27/3248* (2013.01); *H01L 27/3265* (2013.01); *H01L 29/41775* (2013.01); *H01L 29/458* (2013.01); *H01L 29/4908* (2013.01); *H01L 29/4958* (2013.01); *H01L 29/66757* (2013.01); *H01L 29/78603* (2013.01); *H01L 29/78675* (2013.01); *H01L 51/5215* (2013.01); *H01L 51/56* (2013.01); *H01L 2227/323* (2013.01); *H01L 2251/306* (2013.01); *H01L 2251/308* (2013.01)

(58) Field of Classification Search
CPC ......... H01L 21/202592; H01L 21/0262; H01L 21/02675; H01L 21/30604; H01L 29/41775; H01L 29/4908; H01L 29/4958; H01L 29/66757; H01L 29/78603; H01L 29/78675; H01L 51/5215; H01L 51/56
See application file for complete search history.

(56) References Cited

U.S. PATENT DOCUMENTS

| | | | | |
|---|---|---|---|---|
| 2006/0214901 | A1* | 9/2006 | Nagatsuka | G09G 3/3291 345/100 |
| 2008/0128702 | A1* | 6/2008 | Yamazaki | H01L 27/12 257/66 |
| 2009/0021685 | A1* | 1/2009 | Louwsma | H01L 51/56 349/156 |
| 2009/0206737 | A1* | 8/2009 | Liu | H01L 27/1214 313/504 |
| 2011/0297951 | A1* | 12/2011 | Shin | H01L 27/1288 257/71 |

* cited by examiner

MANUFACTURE METHOD OF AMOLED BACK PLATE AND STRUCTURE THEREOF

FIELD OF THE INVENTION

The present invention relates to a display technology field, and more particularly to a manufacture method of an AMOLED back plate and a structure thereof.

BACKGROUND OF THE INVENTION

In the display skill field, Liquid Crystal Display (LCD), Organic Light Emitting Diode (OLED) and other panel display skills have been gradually replaced the CRT displays. The OLED possesses many outstanding properties of self-illumination, low driving voltage, high luminescence efficiency, fast response, high clarity and contrast, near 180° view angle, wide range of working temperature, applicability of flexible display and large scale full color display. The OLED is considered as the most potential flat panel display technology.

The OLED can be categorized as Passive matrix OLED (PMOLED) and Active matrix OLED (AMOLED) according to the driving types. Generally, the AMOLED comprises a Low Temperature Poly-Silicon (LTPS) drive back plate and an electroluminescence layer for being the self-illumination component. The Low Temperature Poly-Silicon possesses higher electron mobility. For the AMOLED, the LTPS material possesses advantages of high resolution, fast response, high brightness, high aperture ratio, low power consumption, et cetera.

A structure of an AMOLED back plate according to prior art is shown in FIG. 1. The manufacture process of the AMOLED back plate generally is:

step 1, deposing a buffer layer 200 on a glass substrate 100;

step 2, deposing an amorphous silicon layer (a-Si) on the buffer layer 200, and using the Laser process to make the amorphous silicon layer to be crystallized and converted to be a polysilicon layer (Poly-Si);

step 3, patterning the polysilicon layer with photo and etch processes to form a first polysilicon section 301 and a second polysilicon section 303;

step 4, deposing an N type heavy doped amorphous silicon layer N+a-Si on the buffer layer 200, the first polysilicon section 301 and the second polysilicon section 303, and implementing the photo process to define the position of the channel 400, and etching to pattern the N type heavy doped amorphous silicon layer N+a-Si for forming a source/a drain 401 on the first polysilicon section 301 and an electrode 403 on the second polysilicon section 303 except an area corresponding to the channel 400;

step 5, deposing and patterning the gate isolation layer 500 on the buffer layer 200, the source/the drain 401 and the electrode 403;

step 6, deposing and patterning a first metal layer on the gate isolation layer 500 to form the gate 601 and a metal electrode 603; the gate 601 is above the source/the drain 401, and partially overlaps with the source/the drain 401 in the horizontal direction;

step 7, sequentially forming an interlayer insulation layer 700, a metal source/a metal drain 801, a flat layer 900, an anode 1000, a pixel definition layer 1100 and a photo spacer 1200 on the gate isolation layer 500, the gate 601 and the metal electrode 603 with deposition, photo and etch processes.

The metal source/the metal drain 801 are electrically connected to the source/the drain 401; the anode 1000 is electrically connected to the metal source/the metal drain 801.

The first polysilicon section 301, the source/the drain 401, the gate 601 and the metal source/the metal drain 801 construct a drive TFT, and the second polysilicon section 303, the electrode 403 and the metal electrode 603 construct a storage capacitor.

The drive TFT of the AMOLED back plate shown in FIG. 1 is a NMOS, the AMOLED panel can occur the phenomenon of image sticking more easily. Besides, the contact resistance between the source/the drain 401 formed with the N type heavy doped amorphous silicon layer N+a-Si and the first polysilicon section 301 is higher, and thus, the conductive current of the drive TFT can be lower, and the source/the drain 401 and the gate 601 partially overlap in the horizontal direction, which can cause the leakage current of the drive TFT to be over high.

SUMMARY OF THE INVENTION

An objective of the present invention is to provide a manufacture method of an AMOLED back plate, which can improve the electrical property of the drive TFT to make the conductive current higher, and the leakage current lower, and diminish the image sticking for raising the display quality of the AMOLED.

Another objective of the present invention is to provide an AMOLED back plate, which can improve the electrical property of the drive TFT to make the conductive current higher, and the leakage current lower, and diminish the image sticking for raising the display quality of the AMOLED.

For realizing the aforesaid objectives, the present invention provides a manufacture method of an AMOLED back plate, sequentially deposing a buffer layer, an amorphous silicon layer on a substrate, and crystallizing and converting the amorphous silicon layer to be a polysilicon layer, and patterning the polysilicon layer, and then deposing a P type heavy doped micro silicon layer, and implementing a photo process to define a position of a channel, and etching the P type heavy doped micro silicon layer to form a source/a drain, and thereafter, sequentially forming a gate isolation layer, a gate, an interlayer insulation layer, a metal source/a metal drain, a flat layer, an anode, a pixel definition layer and a photo spacer; the source/the drain and the gate do not overlap in the horizontal direction and are mutually spaced.

The manufacture method of the AMOLED back plate comprises steps of:

step 1, providing a substrate and deposing the buffer layer on the substrate;

step 2, deposing the amorphous silicon layer on the buffer layer, and implementing an Excimer Laser Annealing process to the amorphous silicon layer to make the amorphous silicon layer to be crystallized and converted to be the polysilicon layer;

step 3, patterning the polysilicon layer with photo and etch processes to form a first polysilicon section and a second polysilicon section;

step 4, deposing the P type heavy doped micro silicon layer on the buffer layer, the first polysilicon section and the second polysilicon section, and implementing the photo process to define the position of the channel, and etching the P type heavy doped micro silicon layer to pattern the P type heavy doped micro silicon layer for forming the source/the drain on the first polysilicon section and an electrode on the second polysilicon section except an area corresponding to the channel;

step 5, deposing and patterning the gate isolation layer on the buffer layer, the source/the drain and the electrode;

step 6, deposing and patterning a first metal layer on the gate isolation layer to form the gate and a metal electrode;

the gate is above the channel, and the source/the drain and the gate are mutually spaced with a certain distance in the horizontal direction;

step 7, sequentially forming the interlayer insulation layer, the metal source/the metal drain, the flat layer, the anode, the pixel definition layer and the photo spacer on the gate isolation layer, the gate and the metal electrode with deposition, photo and etch processes;

the metal source/the metal drain are electrically connected to the source/the drain; the anode is electrically connected to the metal source/the metal drain;

the first polysilicon section, the source/the drain, the gate and the metal source/the metal drain construct a drive TFT, and the second polysilicon section, the electrode and the metal electrode construct a storage capacitor.

In the step 4, the P type heavy doped micro silicon layer is deposed by CVD.

The mutually spaced distance of the source/the drain and the gate in the horizontal direction is 0.1-0.5 μm.

Material of the gate is a stack combination of one or more of molybdenum, titanium, aluminum and copper.

Material of the buffer layer is Silicon Nitride, Silicon Oxide, or a combination of the two; material of the interlayer insulation layer is Silicon Oxide, Silicon Nitride or a combination of the two.

Material of the anode is an Indium Tin Oxide/Silver/Indium Tin Oxide compound thin film.

The present invention further provides a structure of an AMOLED back plate, comprising a substrate, a buffer layer located on the substrate, a first polysilicon section and a second polysilicon section arranged in space on the buffer layer, a source/a drain and an electrode respectively located on the first polysilicon section and the second polysilicon section, a gate isolation layer located on the buffer layer, the source/the drain and the electrode, a gate and a metal electrode located on the gate isolation layer, and an interlayer insulation layer, a metal source/a metal drain, a flat layer, an anode, a pixel definition layer and a photo spacer, sequentially formed on the gate isolation layer, the gate and the metal electrode; the metal source/the metal drain are electrically connected to the source/the drain; the anode is electrically connected to the metal source/the metal drain;

material of the source/the drain is P type heavy doped micro silicon; a channel is located between the source/the drain; the gate is above the channel, and the source/the drain and the gate are mutually spaced in the horizontal direction;

the first polysilicon section, the source/the drain, the gate and the metal source/the metal drain construct a drive TFT, and the second polysilicon section, the electrode and the metal electrode construct a storage capacitor.

The mutually spaced distance of the source/the drain and the gate in the horizontal direction is 0.1-0.5 μm.

Material of the gate is a stack combination of one or more of molybdenum, titanium, aluminum and copper; material of the buffer layer is Silicon Nitride, Silicon Oxide, or a combination of the two; material of the interlayer insulation layer is Silicon Oxide, Silicon Nitride or a combination of the two; material of the anode is an Indium Tin Oxide/Silver/Indium Tin Oxide compound thin film.

The present invention further provides a structure of an AMOLED back plate, comprising a substrate, a buffer layer located on the substrate, a first polysilicon section and a second polysilicon section arranged in space on the buffer layer, a source/a drain and an electrode respectively located on the first polysilicon section and the second polysilicon section, a gate isolation layer located on the buffer layer, the source/the drain and the electrode, a gate and a metal electrode located on the gate isolation layer, and an interlayer insulation layer, a metal source/a metal drain, a flat layer, an anode, a pixel definition layer and a photo spacer, sequentially formed on the gate isolation layer, the gate and the metal electrode; the metal source/the metal drain are electrically connected to the source/the drain; the anode is electrically connected to the metal source/the metal drain;

material of the source/the drain is P type heavy doped micro silicon; a channel is located between the source/the drain; the gate is above the channel, and the source/the drain and the gate are mutually spaced in the horizontal direction;

the first polysilicon section, the source/the drain, the gate and the metal source/the metal drain construct a drive TFT, and the second polysilicon section, the electrode and the metal electrode construct a storage capacitor;

wherein the mutually spaced distance of the source/the drain and the gate in the horizontal direction is 0.1-0.5 μm;

wherein material of the gate is a stack combination of one or more of molybdenum, titanium, aluminum and copper; material of the buffer layer is Silicon Nitride, Silicon Oxide, or a combination of the two; material of the interlayer insulation layer is Silicon Oxide, Silicon Nitride or a combination of the two; material of the anode is an Indium Tin Oxide/Silver/Indium Tin Oxide compound thin film.

The benefits of the present invention are: the present invention provides a manufacture method of an AMOLED back plate. By deposing and patterning the P type heavy doped micro silicon layer to form the source/the drain, and making the source/the drain and the gate be mutually spaced in the horizontal direction, the contact resistance between the source/the drain and the first polysilicon section can be reduced to improve the electrical property of the drive TFT to make the conductive current higher, and the leakage current lower, and diminish the image sticking for raising the display quality of the AMOLED; the present invention provides a structure of an AMOLED back plate. By locating the source/the drain of which the material is P type heavy doped micro silicon, and locating the source/the drain and the gate to be mutually spaced in the horizontal direction, the contact resistance between the source/the drain and the first polysilicon section can be reduced to improve the electrical property of the drive TFT to make the conductive current higher, and the leakage current lower, and diminish the image sticking for raising the display quality of the AMOLED.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

For better explaining the technical solution and the effect of the present invention, the present invention will be further described in detail with the accompanying drawings and the specific embodiments.

Please refer from FIG. 2 to FIG. 7, the present invention provides a manufacture method of an AMOLED back plate, comprising steps of:

step 1, providing a substrate 1 and deposing the buffer layer 2 on the substrate 1.

The substrate 1 is a transparent substrate. Preferably, the substrate 1 is a glass substrate or a plastic substrate.

Figure 1:
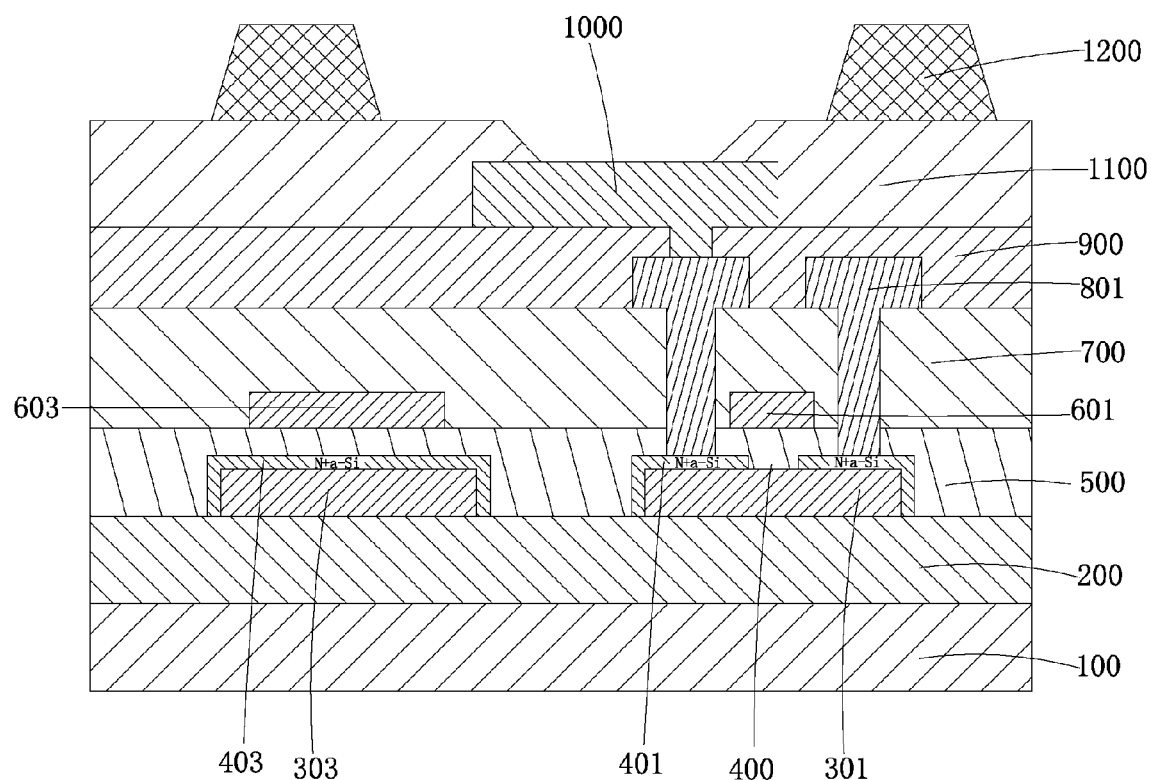
FIG. 1 is a diagram of an AMOLED back plate structure according to prior art.
Figure 2:
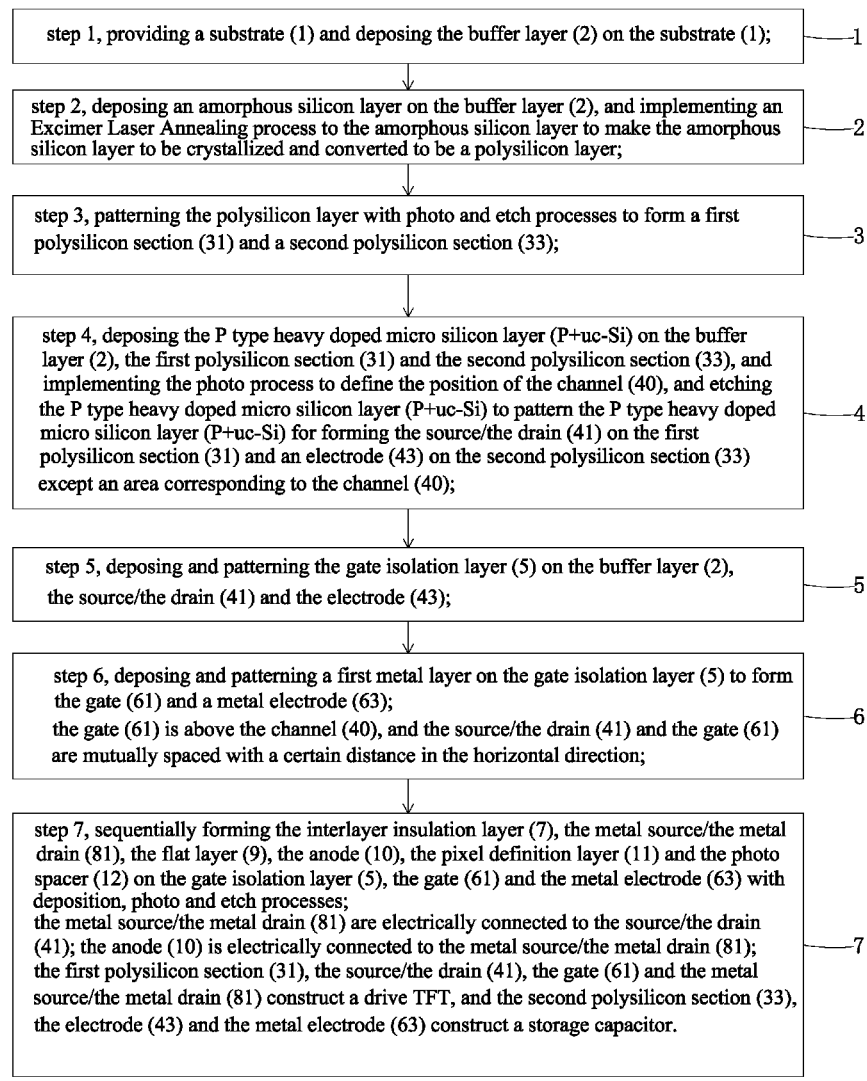
FIG. 2 is a flowchart of a manufacture method of an AMOLED back plate according to the present invention.
Figure 3:
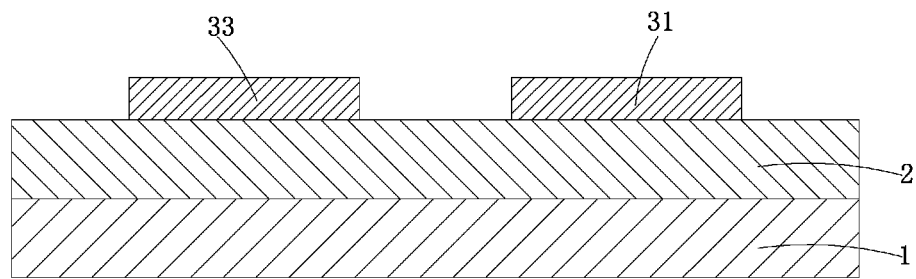
FIG. 3 is a diagram of step 3 in the manufacture method of the AMOLED back plate according to the present invention.
Figure 4:
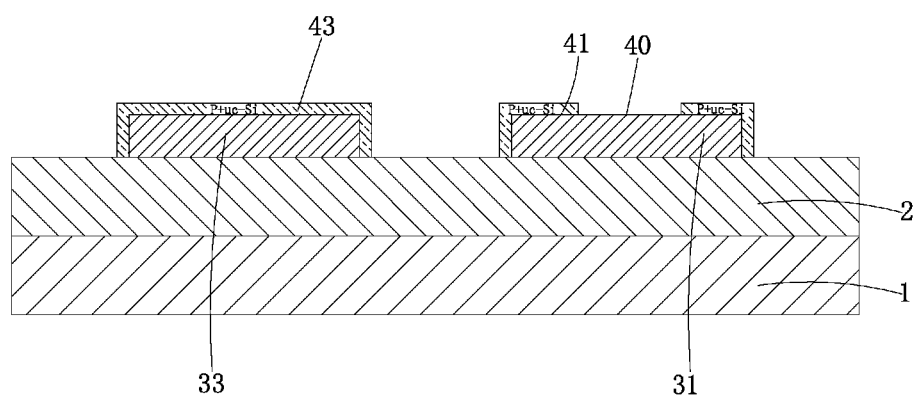
FIG. 4 is a diagram of step 4 in the manufacture method of the AMOLED back plate according to the present invention.
Figure 5:
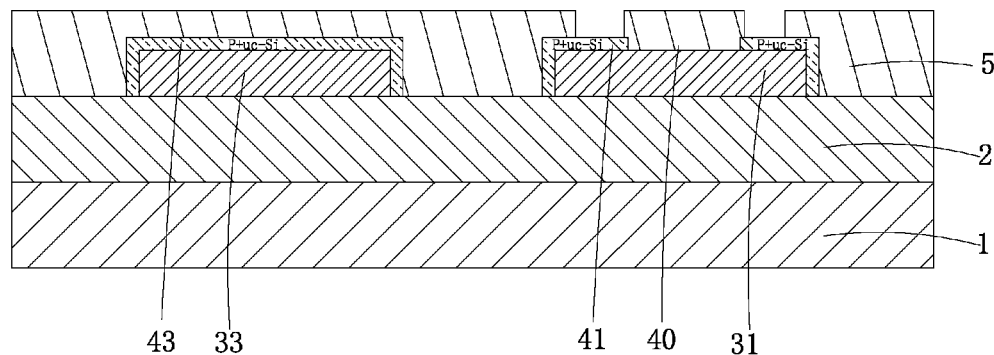
FIG. 5 is a diagram of step 5 in the manufacture method of the AMOLED back plate according to the present invention.
Figure 6:
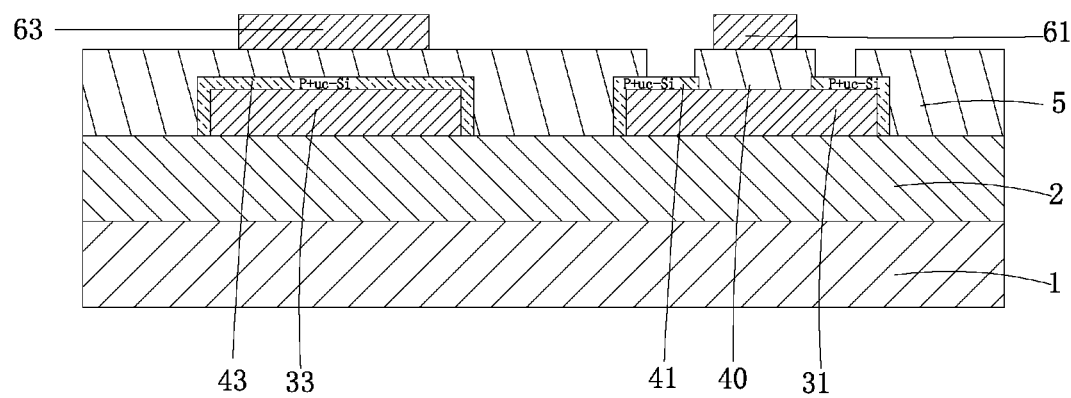
FIG. 6 is a diagram of step 6 in the manufacture method of the AMOLED back plate according to the present invention.

Material of the buffer layer 2 is Silicon Nitride (SiNx), Silicon Oxide (SiOx), or a combination of the two.

step 2, deposing an amorphous silicon layer on the buffer layer 2, and implementing an Excimer Laser Annealing process to the amorphous silicon layer to make the amorphous silicon layer to be crystallized and converted to be a polysilicon layer.

step 3, as shown in FIG. 3, patterning the polysilicon layer with photo and etch processes to form a first polysilicon section 31 and a second polysilicon section 33.

step 4, as shown in FIG. 4, deposing the P type heavy doped micro silicon (P+micro-crystallized Si) layer P+uc-Si on the buffer layer 2, the first polysilicon section 31 and the second polysilicon section 33 by Chemical Vapor Deposition (CVD), and implementing the photo process to define the position of the channel 40, and etching the P type heavy doped micro silicon layer P+uc-Si to pattern the P type heavy doped micro silicon layer P+uc-Si for forming the source/the drain 41 on the first polysilicon section 31 and an electrode 43 on the second polysilicon section 33 except an area corresponding to the channel 40.

step 5, as shown in FIG. 5, deposing and patterning the gate isolation layer 5 on the buffer layer 2, the source/the drain 41 and the electrode 43.

step 6, as shown in FIG. 6, deposing and patterning a first metal layer on the gate isolation layer 5 to form the gate 61 and a metal electrode 63.

The gate 61 is above the channel 40, and the source/the drain 41 and the gate 61 are mutually spaced with a certain distance in the horizontal direction. Furthermore, the mutually spaced distance of the source/the drain 41 and the gate 61 in the horizontal direction is 0.1-0.5 μm.

Figure 7:
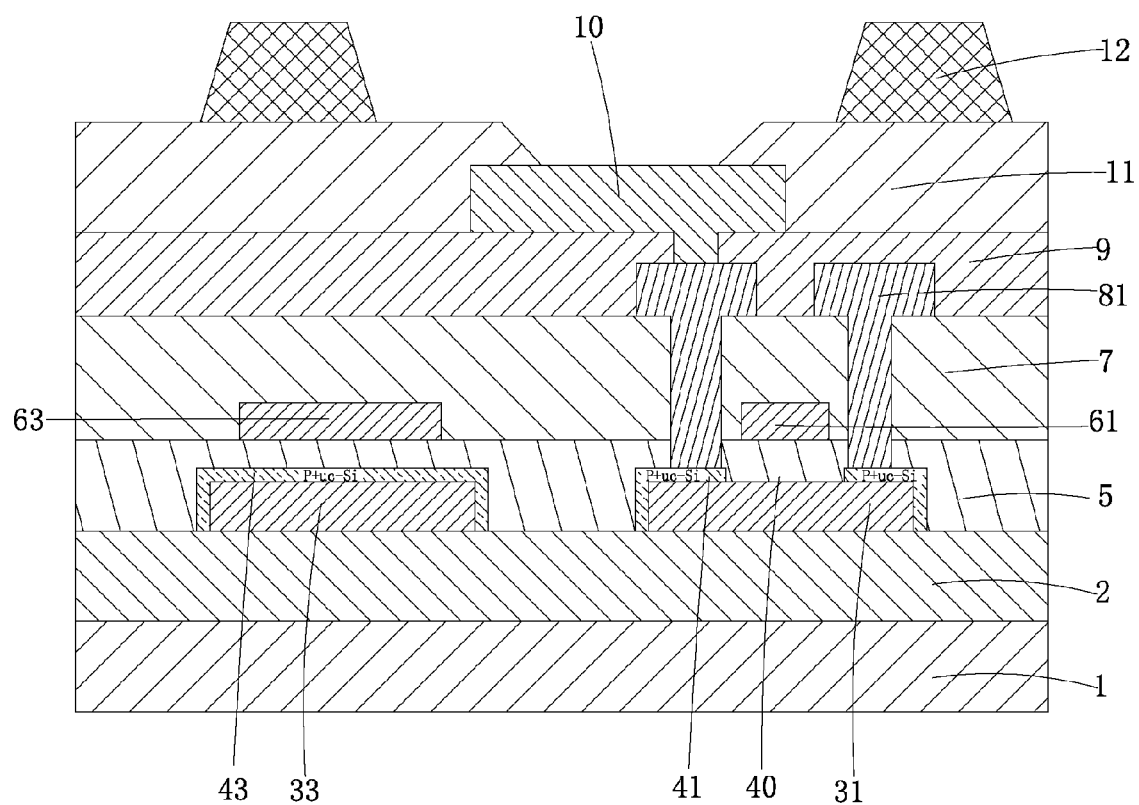
FIG. 7 is a diagram of step 7 in the manufacture method of the AMOLED back plate and a diagram of a structure of the AMOLED back plate according to the present invention.

Material of the gate 61 and the metal electrode 63 is a stack combination of one or more of molybdenum (Mo), titanium (Ti), aluminum (Al) and copper (Cu).

step 7, as shown in FIG. 7, sequentially forming the interlayer insulation layer 7, the metal source/the metal drain 81, the flat layer 9, the anode 10, the pixel definition layer 11 and the photo spacer 12 on the gate isolation layer 5, the gate 61 and the metal electrode 63 with deposition, photo and etch processes.

The metal source/the metal drain 81 are electrically connected to the source/the drain 41; the anode 10 is electrically connected to the metal source/the metal drain 81.

Material of the interlayer insulation layer 7 is Silicon Oxide, Silicon Nitride or a combination of the two. Material of the anode 10 is an Indium Tin Oxide/Silver/Indium Tin Oxide (ITO/Ag/ITO) compound thin film.

The first polysilicon section 31, the source/the drain 41, the gate 61 and the metal source/the metal drain 81 construct a drive TFT, and the second polysilicon section 33, the electrode 43 and the metal electrode 63 construct a storage capacitor.

In the aforesaid manufacture method of the AMOLED back plate, the source/the drain 41 is obtained by deposing and patterning the P type heavy doped micro silicon layer P+uc-Si, thus, the drive TFT is a P type TFT, and the AMOLED driven by the P type TFT can diminish the image sticking for raising the display quality of the AMOLED; meanwhile, the material property of the P type heavy doped micro silicon is more similar with that of the polysilicon, the contact resistance between the source/the drain 41 and the first polysilicon section 31 can be reduced to improve the electrical property of the drive TFT to make the conductive current higher; the source/the drain 41 and the gate 61 are mutually spaced in the horizontal direction with no overlapping area to make the leakage current of the drive TFT lower.

Please refer to FIG. 7, the present invention further provides a structure of an AMOLED back plate, comprising a substrate 1, a buffer layer 2 located on the substrate 1, a first polysilicon section 31 and a second polysilicon section 33 arranged in space on the buffer layer 2, a source/a drain 41 and an electrode 43 respectively located on the first polysilicon section 31 and the second polysilicon section 33, a gate isolation layer 5 located on the buffer layer 2, the source/the drain 41 and the electrode 43, a gate 61 and a metal electrode 63 located on the gate isolation layer 5, and an interlayer insulation layer 7, a metal source/a metal drain 81, a flat layer 9, an anode 10, a pixel definition layer 11 and a photo spacer 12, sequentially formed on the gate isolation layer 5, the gate 61 and the metal electrode 63.

The metal source/the metal drain 81 are electrically connected to the source/the drain 41. The anode 10 is electrically connected to the metal source/the metal drain 81. The first polysilicon section 31, the source/the drain 41, the gate 61 and the metal source/the metal drain 81 construct a drive TFT, and the second polysilicon section 33, the electrode 43 and the metal electrode 63 construct a storage capacitor.

Material of the source/the drain 41 is P type heavy doped micro silicon (P+uc-Si); a channel 40 is located between the source/the drain 41; the gate 61 is above the channel 40, and the source/the drain 41 and the gate 61 do not overlap and are mutually spaced in the horizontal direction. Furthermore, the mutually spaced distance of the source/the drain 41 and the gate 61 in the horizontal direction is 0.1-0.5 μm.

Specifically, the substrate 1 is a transparent substrate. Preferably, the substrate 1 is a glass substrate or a plastic substrate. Material of the gate 61 is a stack combination of one or more of molybdenum, titanium, aluminum and copper. Material of the buffer layer 2 is Silicon Nitride, Silicon Oxide, or a combination of the two. Material of the interlayer insulation layer 7 is Silicon Oxide, Silicon Nitride or a combination of the two. Material of the anode 10 is an Indium Tin Oxide/Silver/Indium Tin Oxide compound thin film.

In the aforesaid structure of the AMOLED back plate, the material of the source/the drain 41 is P type heavy doped micro silicon P+uc-Si, thus, the drive TFT is a P type TFT, and the AMOLED driven by the P type TFT can diminish the image sticking for raising the display quality of the AMOLED; meanwhile, the material property of the P type heavy doped micro silicon is more similar with that of the polysilicon, the contact resistance between the source/the drain 41 and the first polysilicon section 31 can be reduced to improve the electrical property of the drive TFT to make the conductive current higher; the source/the drain 41 and the gate 61 are mutually spaced in the horizontal direction with no overlapping area to make the leakage current of the drive TFT lower.

In conclusion, in the manufacture method of an AMOLED back plate of the present invention, by deposing and patterning the P type heavy doped micro silicon layer to form the source/the drain, and making the source/the drain and the gate be mutually spaced in the horizontal direction, the contact resistance between the source/the drain and the first polysilicon section can be reduced to improve the electrical property of the drive TFT to make the conductive current higher, and the leakage current lower, and diminish the image sticking for raising the display quality of the AMOLED; in the structure of an AMOLED back plate of the present invention, by locating the source/the drain of which the material is P type heavy doped micro silicon, and locating the source/the drain and the gate to be mutually spaced in the horizontal direction, the contact resistance between the source/the drain and the first polysilicon section can be reduced to improve the electrical property of the drive TFT to make the conductive current higher, and the leakage current lower, and diminish the image sticking for raising the display quality of the AMOLED.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A manufacture method of an AMOLED back plate, sequentially deposing a buffer layer, an amorphous silicon layer on a substrate, and crystallizing and converting the amorphous silicon layer to be a polysilicon layer, and patterning the polysilicon layer, and then deposing a P type heavy doped micro silicon layer, and implementing a photo process to define a position of a channel, and etching the P type heavy doped micro silicon layer to form a source/a drain, and thereafter, sequentially forming a gate isolation layer, a gate, an interlayer insulation layer, a metal source/a metal drain, a flat layer, an anode, a pixel definition layer and a photo spacer; the source/the drain and the gate do not overlap in the horizontal direction and are mutually spaced, and comprising the following steps:

step 1, providing a substrate and deposing the buffer layer on the substrate;

step 2, deposing the amorphous silicon layer on the buffer layer, and implementing an excimer laser annealing process to the amorphous silicon layer to make the amorphous silicon layer to be crystallized and converted to be the polysilicon layer;

step 3, patterning the polysilicon layer with photo and etch processes to form a first polysilicon section and a second polysilicon section;

step 4, deposing the P type heavy doped micro silicon layer on the buffer layer, the first polysilicon section and the second polysilicon section, and implementing the photo process to define the position of the channel, and etching the P type heavy doped micro silicon layer to pattern the P type heavy doped micro silicon layer for forming the source/the drain on the first polysilicon section and an electrode on the second polysilicon section except an area corresponding to the channel;

step 5, deposing and patterning the gate isolation layer on the buffer layer, the source/the drain and the electrode;

step 6, deposing and patterning a first metal layer on the gate isolation layer to form the gate and a metal electrode, wherein the gate is above the channel, and the source/the drain and the gate are mutually spaced with a certain distance in the horizontal direction; and step 7, sequentially forming the interlayer insulation layer, the metal source/the metal drain, the flat layer, the anode, the pixel definition layer and the photo spacer on the gate isolation layer, the gate and the metal electrode with deposition, photo and etch processes, wherein the metal source/the metal drain are electrically connected to the source/the drain; and the anode is electrically connected to the metal source/the metal drain;

wherein the first polysilicon section, the source/the drain, the gate and the metal source/the metal drain construct a drive TFT, and the second polysilicon section, the electrode and the metal electrode construct a storage capacitor.

2. The manufacture method of the AMOLED back plate according to claim 1, wherein in step 4, the P type heavy doped micro silicon layer is deposed by CVD.

3. The manufacture method of the AMOLED back plate according to claim 1, wherein the mutually spaced distance of the source/the drain and the gate in the horizontal direction is 0.1-0.5µm.

4. The manufacture method of the AMOLED back plate according to claim 1, wherein material of the gate is a stack combination of one or more of molybdenum, titanium, aluminum and copper.

5. The manufacture method of the AMOLED back plate according to claim 1, wherein material of the buffer layer is Silicon Nitride, Silicon Oxide, or a combination of the two; material of the interlayer insulation layer is Silicon Oxide, Silicon Nitride or a combination of the two.

6. The manufacture method of the AMOLED back plate according to claim 1, wherein material of the anode is an Indium Tin Oxide/Silver/Indium Tin Oxide compound thin film.

* * * * *